US008362775B2

(12) United States Patent
Nistler et al.

(10) Patent No.: US 8,362,775 B2
(45) Date of Patent: Jan. 29, 2013

(54) MAGNETIC RESONANCE WHOLE BODY ANTENNA SYSTEM, ELLIPTICALLY POLARIZED WITH MAJOR ELLIPSE AXIS TILTED/NON-HORIZONTAL AT LEAST WHEN UNOCCUPIED BY AN EXAMINATION SUBJECT

(75) Inventors: Juergen Nistler, Erlangen (DE); Wolfgang Renz, Erlangen (DE); Thorsten Speckner, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 1043 days.

(21) Appl. No.: 12/358,378

(22) Filed: Jan. 23, 2009

(65) Prior Publication Data

US 2009/0192382 A1 Jul. 30, 2009

(51) Int. Cl.
*G01V 3/00* (2006.01)
*A61B 5/055* (2006.01)

(52) U.S. Cl. ........ 324/318; 324/309; 324/307; 600/410; 600/420

(58) Field of Classification Search .......... 324/300–322; 600/407–435; 382/128–131
See application file for complete search history.

(56) References Cited

U.S. PATENT DOCUMENTS

| | | | | | |
|---|---|---|---|---|---|
| 4,766,383 | A | * | 8/1988 | Fox et al. | 324/318 |
| 6,806,713 | B2 | * | 10/2004 | Wong | 324/318 |
| 6,885,194 | B2 | | 4/2005 | Boskamp | 324/318 |
| 6,900,636 | B2 | | 5/2005 | Leussler | 324/318 |
| 7,109,712 | B2 | | 9/2006 | Boskamp | 324/318 |
| 7,135,864 | B1 | * | 11/2006 | McKinnon et al. | 324/318 |
| 7,986,142 | B2 | * | 7/2011 | Eberler et al. | 324/318 |
| 2009/0189609 | A1 | * | 7/2009 | Eberler et al. | 324/322 |
| 2009/0192382 | A1 | * | 7/2009 | Nistler et al. | 600/410 |
| 2011/0118556 | A1 | * | 5/2011 | Siegel et al. | 600/300 |

OTHER PUBLICATIONS

Patent Abstracts of Japan Publication No. 07222729 A—Aug. 22, 1995.
Brock Haus Enzyklopädie (2006) vol. 13, p. 441.

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

A magnetic resonance system obtaining magnetic resonance exposures of an examination subject, has an examination tunnel, a whole-body antenna with two connection terminals. The whole-body antenna cylindrically extends around the examination tunnel along a longitudinal axis. The system has a radio-frequency supply device in order to respectively supply the whole-body antenna with radio-frequency signals for emission of a radio-frequency field in the examination tunnel. The radio-frequency supply device has a radio-frequency generator for generation of a radio-frequency signal, a signal splitter that divides a radio-frequency signal coming from the radio-frequency generator into two partial signals that are phase-shifted by 90° relative to one another. Two radio-frequency feed lines are connected with the two connection terminals of the whole-body antenna. Via these radio-frequency feed lines, the two partial signals are fed into the whole-body antenna. The whole-body antenna has an intrinsic transmission characteristic such that a radio-frequency field is emitted that is elliptically polarized in a defined manner in a plane lying perpendicular to the longitudinal axis (at least in the unloaded state of the examination tunnel).

19 Claims, 4 Drawing Sheets

MAGNETIC RESONANCE WHOLE BODY ANTENNA SYSTEM, ELLIPTICALLY POLARIZED WITH MAJOR ELLIPSE AXIS TILTED/NON-HORIZONTAL AT LEAST WHEN UNOCCUPIED BY AN EXAMINATION SUBJECT

BACKGROUND OF THE INVENTION

1. Field of the Invention

The invention concerns a magnetic resonance system of the type having an examination tunnel and a whole-body antenna with two connection terminals that extends like a cylinder around the examination tunnel along a longitudinal axis, and a radio-frequency supply device in order to respectively supply the whole-body antenna with radio-frequency signals for emission of an radio-frequency field in the examination tunnel. The radio-frequency supply device has a radio-frequency generator for generation of a radio-frequency signal, a signal splitter that splits a radio-frequency signal (arriving from the radio-frequency generator) to be emitted into two partial signals that are phase-shifted by 90° relative to one another, and two radio-frequency feed lines connected with the two connection points of the whole-body antenna, via which radio-frequency feed lines the two partial signals are fed into the whole-body antenna. Moreover, the invention concerns an antenna system for such a magnetic resonance examination system, a method for designing such a magnetic resonance system and a method to generate magnetic resonance exposures with a corresponding magnetic resonance system.

2. Description of the Prior Art

Magnetic resonance tomography is a technique for acquisition of images of the inside of the body of a living examination subject that has become widespread. In order to acquire an image with this method, the body or a body part of the patient or test subject that is to be examined must initially be exposed to an optimally homogeneous static basic magnetic field which is generated by a basic field magnet of the magnetic resonance system. Rapidly switched gradient fields that are generated by what are known as gradient coils are superimposed on this basic magnetic field during the acquisition of the magnetic resonance images. Moreover, radio-frequency pulses of a defined field strength (known as the "B1 field") are radiated into the examination subject with radio-frequency antennas. The nuclear spins of the atoms in the examination subject are excited by means of these radio-frequency pulses such that they are deflected from their equilibrium position by what is known as an "excitation flip angle" parallel to the basic magnetic field. The nuclear spins then process around the direction of the basic magnetic field. The magnetic resonance signals thereby generated are acquired by radio-frequency acquisition antennas. The magnetic resonance images of the examination subject are ultimately created on the basis of the acquired magnetic resonance signals.

To emit the necessary radio-frequency pulses in the examination tunnel, the tomograph typically possesses a radio-frequency antenna permanently installed in the housing, which is also designated as a "whole-body antenna" or "body coil". Typical designs for whole-body antennas are known as "cage structures" or "birdcage structures", TEM or band antennas as well as saddle coils. Such a whole-body antenna is schematically shown with a cage structure in FIG. 1. The whole-body antenna 2' has antenna rods 7' parallel to the longitudinal axis L and arranged at various circumferential positions around the examination tunnel T, which antenna rods 7' are respectively connected by annular antenna elements 5, 6 at the facing sides. The examination tunnel is thereby defined by the space enclosed by the antenna. Two radio-frequency feed lines 28, 29 of a radio-frequency supply device 20 are connected two connection points 3, 4 that are arranged offset from one another by 90° along the circumference on one of the annular antenna elements. FIG. 1 shows the design of such a radio-frequency supply device that is most frequently used at present. A radio-frequency signal RF is emitted by a radio-frequency generator 21 which possesses a suitable radio-frequency amplifier at the output side. This radio-frequency signal RF is fed into a first input 24 of a signal splitter 23. Said signal splitter 23 is hereby what is known as a hybrid module that divides the radio-frequency signal RF into two partial signals RF1, RF2 which are phase-shifted by 90° but are otherwise identical. These two partial signals RF1, RF2 are present at the outputs 26, 27 of the signal splitter 23 and there are provided on the radio-frequency feed lines 28, 29 to the connection points 3, 4 of the whole-body antenna 2'. A fourth input 25 of the signal splitter 23 is terminated with a 50Ω resistor 22 in order to accommodate powers reflected by the whole-body antenna 2'. In this design, there is a fixed weighting of the signals at the inputs of the antenna, and the antenna is designed such that it emits a circularly polarized radio-frequency field, meaning that the antenna can emit in precisely one circularly polarized mode MCP (which is symbolically represented by the circular line in FIG. 1).

In particular in newer magnetic resonance systems with basic magnetic field strengths greater than three Tesla, considerable eddy currents are frequently induced in the patient upon radiation of the radio-frequency pulses. As a result of this the actual homogeneous, radiated B1 field is more or less strongly distorted in the examination volume.

There are presently the following approaches in hardware in order to alleviate the problems caused by the field distortions:

Local field corrections can be achieved by the use of dielectric cushions or similar elements influencing the RF field that are placed on the patient.

A second possibility is shown in FIG. 2. This is a design similar to the design in FIG. 1, but respective amplitude and/or phase regulators 30, 31 with which the amplitudes and/or phases of the partial signals RF1, RF2 can be arbitrarily varied are additionally interposed after the outputs 26, 27 of the signal splitter 23 in the radio-frequency feed lines 28, 29. Correspondingly modified partial signals RF1', RF2' are fed into the whole-body antenna 2' designed in the typical manner at the connection points 3, 4. Various radio-frequency modes can be excited in the whole-body antenna 2' via a suitable phase and amplitude shift of the two partial signals RF1', RF2'. Only two of these various radio-frequency modes, namely the circularly polarized mode MCP and an elliptically polarized mode MEP, are symbolically represented in FIG. 2. In the elliptically polarized mode MEP, a radio-frequency field is emitted which is elliptically polarized in a plane lying perpendicular to the longitudinal axis L and not circularly polarized (like the typical circularly polarized field). Which mode MCP, MEP is emitted depends on which amplitude ratio and which phase shift the two partial signals RF1', RF2' have relative to one another. If the amplitudes are equal and the phase shift is 90°, a circularly polarized field is emitted as in the exemplary embodiment according to FIG. 1. A disadvantage of this system is that additional components 30, 31 are required in order to affect the field in the desired manner. These components 30, 31 must be highly precise. A corresponding control technology is additionally required in order to be able to control the components 30, 31 as precisely as possible.

Individual settings of the amplitude values and phase values of a number of radio-frequency pulses emitted by various separate transmission channels are presently discussed as an additional promising approach to the homogenization of the B1 field. An example of this is explained in DE 101 24 465 A1. Such designs are naturally also relatively complicated and expensive.

SUMMARY OF THE INVENTION

An object of the present invention is to provide a magnetic resonance system, an antenna system, a method for designing a magnetic resonance system and a method to generate magnetic resonance exposures with which an improved field distribution can be achieved with as little effort as possible in a whole-body antenna of the magnetic resonance system.

The magnetic resonance system according to the invention has a conventional radio-frequency supply device in which the radio-frequency signal generated by a radio-frequency generator is divided in a typical signal splitter into two identical partial signals that are phase-shifted by 90° relative to one another and then are fed into the whole-body antenna at the two connection points of said whole-body antenna. However, the whole-body antenna is deliberately fashioned so that it has such an intrinsic transmission characteristic that a radio-frequency field which is elliptically polarized in a defined manner in a plane lying perpendicular to the longitudinal axis (at least in the unloaded state of the examination tunnel) is emitted by the whole-body antenna due to the superimposition of the two partial signals that are shifted by 90° but are otherwise identical.

In a number of tests it has been shown that an elliptical polarization in principle leads to a better B1 homogeneity in the patient. This is due to the fact that a circularly polarized field is normally elliptically distorted in the body of the patient due to the eddy currents. If an elliptically polarized field is thus emitted in an unloaded state of the examination tunnel (i.e. without a patient in the examination tunnel), it can be achieved—when the major axis of the ellipse is taken care of for a correspondingly suitable position—that the desired, homogenized radio-frequency field is achieved after the loading of the patent tunnel with a patient body. No modifications or additional structures at the radio-frequency supply device are thereby necessary at all; rather, the conventional radio-frequency supply devices which are typically used to adjust circularly polarized fields can continue to be used. As is shown later using exemplary embodiments, there are various very simple solutions to adjust the intrinsic characteristic of the whole-body antenna.

A corresponding antenna system for a magnetic resonance system must accordingly have a whole-body antenna according to the invention, with such an intrinsic transmission characteristic that, when two identical partial signals phase-shifted by 90° are fed into it at the two connection points, it emits a radio-frequency field which is elliptically polarized in a defined manner in a plane lying perpendicular to the longitudinal axis, at least in the unloaded state of the examination tunnel.

In a method according to the invention for designing such a magnetic resonance system, among other things at least the following method steps must be implemented: a whole-body antenna extending like a cylinder around an examination tunnel along a longitudinal axis must be constructed. Furthermore, a radio-frequency generator for generation of a radio-frequency signal must be connected to a signal splitter which divides a radio-frequency signal arriving from the radio-frequency signal generator into two partial signals phase-shifted by 90° relative to one another which are output at two signal outputs of the signal splitter. A connection of the two signal outputs of the signal splitter must then ensue via two feed lines with two connection points at the whole-body antenna. The whole-body antenna must be designed so that it has the specific intrinsic transmission characteristic in order to emit a field elliptically polarized in a defined manner, at least in the unloaded state of the examination tunnel.

As is typical, in a method according to the invention for generation of magnetic resonance exposures a radio-frequency signal is divided into two partial signals that are identical but phase-shifted by 90°, and these partial signals are fed at two connection points into a whole-body antenna cylindrically extending around the examination tunnel along a longitudinal axis, which whole-body antenna thereupon emits a radio-frequency field. In the method according to the invention a previously cited whole-body antenna is used, but it has an intrinsic transmission characteristic in order to emit an elliptically polarized field in an unloaded state of the examination tunnel.

As already explained, typical whole-body antennas are designed so that these emit an essentially (i.e. apart from typical, build-dependent tolerances) circularly polarized field given an infeed of identical signals phase-shifted by 90° at two connection points. In contrast to this, the intrinsic transmission characteristic of the whole-body antenna according to the invention is selected so that it emits an elliptically polarized radio-frequency field under these conditions. The antenna system is thereby particularly preferably fashioned so that an elliptically polarized radio-frequency field forms in which the ratio of the major ellipse axis to the minor ellipse axis is approximately between 1.5 and 10, particularly preferably approximately between 2 and 5. This means that a distinctly elliptical form is preferred which does not deviate only slightly from a circle shape.

In principle, the antenna system can be fashioned so that the elliptically polarized radio-frequency field possesses an arbitrary bearing. However, the antenna system is particularly preferably fashioned so that an elliptically polarized radio-frequency field forms in which the major ellipse axis is tilted by an angle $\alpha$ relative to the horizontal. This means that the elliptically polarized radio-frequency field preferably lies diagonally in space. In a plurality of test measurements it has turned out that it is optimal when the antenna system is fashioned so that—considered from the head of the examination tunnel—the angle by which the major ellipse axis is tilted clockwise relative to the horizontal lies inclusively between approximately 15° and approximately 70°, particularly preferably inclusively between approximately 22° and approximately 50°. At the side known as the "service side" of the magnetic resonance scanner, at which the connections to the additional components of the magnetic resonance system are normally located, is thereby viewed as the head of the examination tunnel. This is the side that is situated opposite the examination table feed side at which the examination table is driven into and out from the examination tunnel. That is typically also the side at which the head of the patient is located. However, it has also turned out that, given a dorsal position of the patient (independent of whether he is moved into the examination tunnel head first or feet first), the elliptically polarized radio-frequency field is in particular optimal for acquisitions of the abdominal region of the patient when the major ellipse axis lies in the cited angle range.

In order to achieve an elliptically distorted radio-frequency field in the whole-body antenna, in principle it is sufficient to modify the connection points so that they do not lie below an angle of 90° relative to one another along the circumference of the antenna. If two partial signals that are phase-shifted by 90° relative to one another are then fed in at these connection points, a non-circularly polarized field already inevitably forms. On the other hand, an infeed of the partial signals at an angle≠90° leads in a typical antenna to an increased reflection at the antenna inputs. This increases the power loss. The antenna structure is therefore advantageously internally fashioned so that the desired elliptically polarized field arises.

In order to achieve the intrinsic transmission characteristic of the whole-body antenna for emission of a field elliptically polarized in a defined manner, the whole-body antenna therefore advantageously possesses antenna elements annularly arranged distributed around the examination tunnel, and the whole-body antenna is thus fashioned and/or arranged relative to a radio-frequency shielding cylindrically surrounding the whole-body antenna such that at least two antenna elements located at different circumferential positions around the examination tunnel exhibit a different impedance. The term "antenna elements", as used herein encompasses the most varied sub-components of the antenna, for example the conductor rods respectively running parallel to the longitudinal axis in a cage antenna or segments of the antenna ring elements respectively coupling the antenna rods with one another on the facing side in terms of radio-frequency. In a TEM or band antenna, these can likewise be the conductor rods respectively running parallel to the longitudinal axis, which conductor rods are respectively, capacitively coupled at the ends with a radio-frequency shielding of the antenna system (instead of a connection via the ferrules) or, respectively the capacitive elements are coupled with the radio-frequency shielding to connect the antenna rods. If an antenna element possesses a higher impedance, a smaller radio-frequency current flows through this antenna element. In contrast to this, a smaller impedance is associated with a higher radio-frequency current. Depending on the setting of the impedances of the various antenna elements, a different RF field distribution is thus generated. The impedance of the antenna elements can vary due to the variation of the inductance and/or the capacitance and/or the ohmic resistance.

A radio-frequency shielding that externally shields the radio-frequency antenna from the further components in the magnetic resonance scanner also typically belongs to an antenna system with such a whole-body antenna. Not only the design of the individual antenna elements but also its position relative to the radio-frequency shielding has an influence on the impedances of the respective antenna elements. The radio-frequency shielding lies at a fixed potential (typically at a ground potential), and the stray capacitances of the antenna elements relative to this potential are influenced by the distance of the antenna elements from the radio-frequency shielding. The inductance of the respective antenna element is additionally reduced given a reduction of the distance of the antenna elements from the radio-frequency shielding. In a preferred exemplary embodiment, the whole-body antenna and the radio-frequency shielding are therefore designed and arranged relative to one another so that a radial separation between the whole-body antenna and the radio-frequency shielding along the circumference changes.

This can be achieved very simply when the whole-body antenna and/or the radio-frequency shielding are fashioned such that they exhibit an elliptical cross-section in a plane lying perpendicular to the longitudinal axis. For example, this means that the whole-body antenna exhibits an elliptical cross-section and the radio-frequency shielding exhibits a circular cross-section, or vice versa. In both cases, the radial distance between the whole-body antenna and the radio-frequency shielding changes along the circumference. The center axes of the whole-body antenna and of the radio-frequency shielding are thereby arranged coaxially, as in conventional systems. It is also likewise possible that both the whole-body antenna and the radio-frequency shielding exhibit an elliptical cross-section. In order to achieve the largest possible differences in the radial separation of the two elements relative to one another, it is reasonable when the major axes of the two ellipses are perpendicular to one another. In principle, however, a distance change is always achieved insofar as the two major axes of the ellipses do not run in the same direction, i.e. when the major axes of the elliptical cross-sections of the whole-body antenna and the radio-frequency shielding are tilted relative to one another.

The whole-body antenna (for example a cage antenna or a band or, respectively, TEM antenna) advantageously has a number of antenna rods running parallel to the longitudinal axis, and at least two antenna rods located at different circumferential positions around the examination tunnel exhibit a different impedance.

As already explained above, the whole-body antenna can have a cage structure in which the plurality of antenna rods running parallel to the longitudinal axis are coupled among one another by antenna ring elements, at least in terms of radio frequencies. These ring elements can respectively be fashioned in circular shape but can also be elliptical. The coupling can in principle be a solid conductor connection. However, these are normally antenna ring elements that are composed of multiple ring segments capacitively coupled among one another that are respectively associated with the individual antenna rods. Given use of such an antenna, preferably at least two antenna rods, located at different circumferential positions around the examination tunnel and/or ring segments of the antenna ring elements, respectively exhibit by different impedances.

Aside from being realizable by a variation of the distances of the individual antenna elements from a radio-frequency shielding, different impedances in the individual antenna elements can be realized by various other measures.

In a very simple variant, the antenna is fashioned so that at least two antenna rods located at different circumferential positions exhibit different conductor cross-sections. The antenna rods are typically fashioned in the form of printed conductor traces that are directly applied on a conduit wall of the examination tunnel. In order to construct a whole-body antenna with the desired elliptically polarized transmission characteristic, it is merely to be ensured that the conductor traces are of different widths, advantageously according to a specific pattern. Since, among other things, the conductor cross-section is representative of the inductance and thus the impedance of the respective antenna rods, a very simple variation of the impedances of the individual antenna rods is possible.

An additional preferred possibility is the use of different capacitances of the antenna rods and/or ring segments located at the different circumferential positions. For example, the antenna rods can consist of partial rods or, respectively, partial conductor traces that are respectively connected among one another with capacitors. The desired capacitance differences can thus be achieved via insertion of different structural elements. Typical capacitance values of such antenna rods are between 10 and 30 pF in a 3 Tesla whole-body antenna. For example, specific antenna rods can then be fashioned so that they exhibit 30 pF, in contrast to which others exhibit only 10 pF.

The ring segments can likewise be coupled to the antenna ring elements with various capacitors along the circumference.

In a band or TEM antenna, different impedances of the individual antenna rods can also be realized via different capacitors and/or inductors in the coupling of the antenna rods with the radio-frequency shielding, for example.

In order to achieve an optimally symmetrical elliptical field, two respective antenna elements located at opposite circumferential positions can advantageously exhibit the same impedance (within the typical tolerances). For example, two first antenna elements located at opposite circumferential positions can exhibit a maximum impedance, and two antenna elements respectively located at 90° relative to the first antenna elements exhibit a minimal impedance. The first antenna elements (which exhibit the maximum impedance) then define the direction of the major ellipse axis and the two second elements which exhibit the minimal impedance define the direction of the minor ellipse axis.

To generate an optimally uniform ellipse shape, the impedance of antenna elements respectively located between the first and second antenna elements lies between the impedances of said first and second antenna elements, and is respectively selected so that the impedance decreases from the first antenna elements to the second antenna elements.

Overall, there are a number of different possibilities to fashion the whole-body antenna so that it exhibits the desired intrinsic transmission characteristic for emission of an elliptically polarized field, wherein only some preferred variants are cited with the statements above. In particular, it is also possible to use the most varied possibilities in combination in order to optimally, specifically achieve the desired effect with as little effort as possible.

DESCRIPTION OF THE PREFERRED EMBODIMENTS

Figure 1:
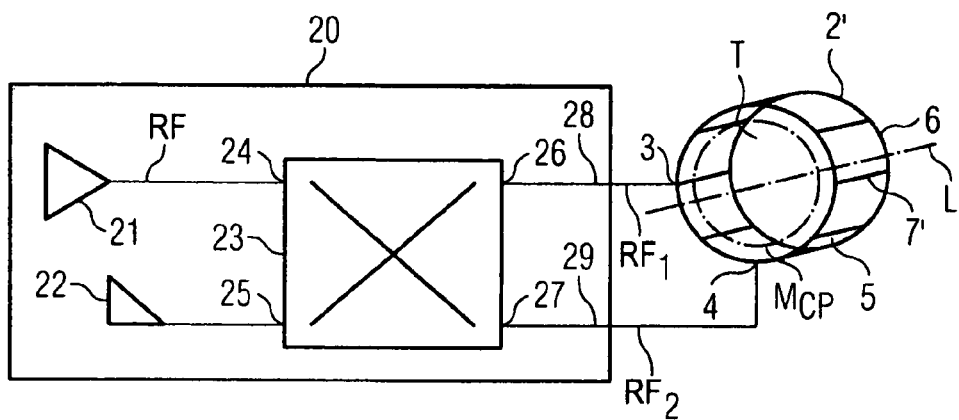
FIG. 1 is a basic block diagram of the transmission system of a magnetic resonance system according to the prior art.
Figure 2:
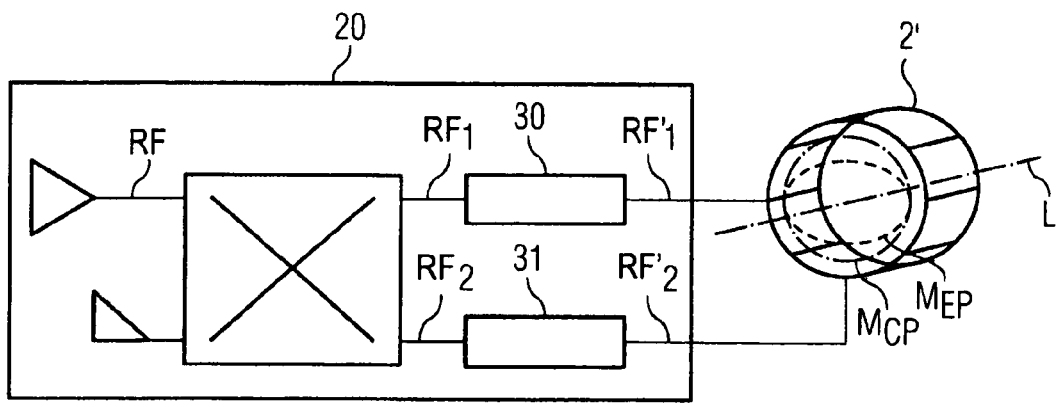
FIG. 2 is a basic block diagram of an expanded transmission system of a magnetic resonance system according to the prior art.

FIGS. 1 and 2 were already explained in detail above. The exemplary prior art embodiment according to FIG. 1 is a typical, presently used whole-body antenna with a cage structure which is supplied by a typical radio-frequency supply device 20. This radio-frequency supply device 20 is fashioned so that the phase ratio between the partial signals $RF_1$, $RF_2$ is established at exactly 90° and the amplitudes are identical within the scope of the typical tolerances. Only a circularly polarized radio-frequency field is ever emitted with this transmission system in the unloaded state of the whole-body antenna 2'.

FIG. 2 shows a more variable exemplary embodiment for a transmission system in which the ratio of the amplitudes and/or phases of the two partial signals $RF_1'$, $RF_2'$ can be freely adjusted relative to one another by means of amplitude and/or phase regulators 30, 31, whereby different transmission modes $M_{CP}$, $M_{EP}$ can be emitted in the whole-body antenna 2'.

Figure 3:
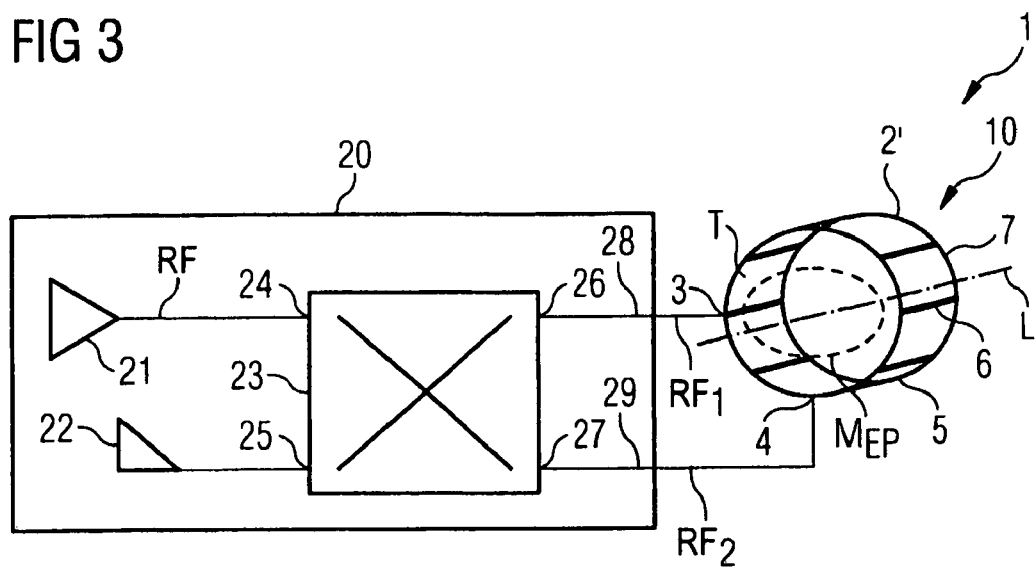
FIG. 3 is a basic block diagram of a first exemplary embodiment of a transmission system of a magnetic resonance system according to the invention.

FIG. 3 now shows an exemplary embodiment for a transmission system of a magnetic resonance system 1 according to the invention. In addition to the transmission system, this magnetic resonance system 1 naturally also includes all additional, typical components of a magnetic resonance system, for example a magnet system, a gradient system, an acquisition system, a controller, etc. These components are sufficiently known to the man skilled in the art and therefore do not need to be explained in detail here. They are thus also not shown in FIG. 1 for better clarity.

In the magnetic resonance system 1 according to the invention, a typical frequency supply device 20 can be used as it is used in the exemplary embodiment according to FIG. 1. This means that no additional components are required here to adjust the phases and/or amplitudes of the partial radio-frequency signals $RF_1$, $RF_2$ relative to one another. The partial signals $RF_1$, $RF_2$ arriving from the radio-frequency supply device 20 at the outputs 26, 27 of the hybrid module 23 via the RF feed line 28, 29 are identical except for a fixed phase shift by 90°.

Here as well a cage antenna 2 with a plurality of conductor rods 7 running parallel to the longitudinal axis L of the whole-body antenna 2 around an examination tunnel T is used as an antenna 2 according the invention, which conductor rods 7 are respectively coupled among one another on the facing side by antenna ring elements 5, 6. Only eight conductor rods 7 of the antenna 2 are shown in the schematic exemplary embodiment according to FIG. 3. However, such a cage antenna typically possesses a higher number, for example sixteen or more conductor rods. Via suitable design measures it is ensured here that the whole-body antenna 2 has an intrinsic transmission characteristic so that an elliptically polarized field forms (i.e. the elliptically polarized transmission mode $M_{EP}$ is excited) although identical partial signals respectively phase-shifted by 90° are fed in at the typical connection points 3, 4 that lie at 90° relative to one another on one of the antenna ring elements 5. In FIG. 3 this mode $M_{EP}$ is shown so that the major axis of the ellipse is located parallel to the horizontal, i.e. parallel to the surface of the recumbent board on which the patient is borne and is moved into the examination tunnel T.

Figure 4:
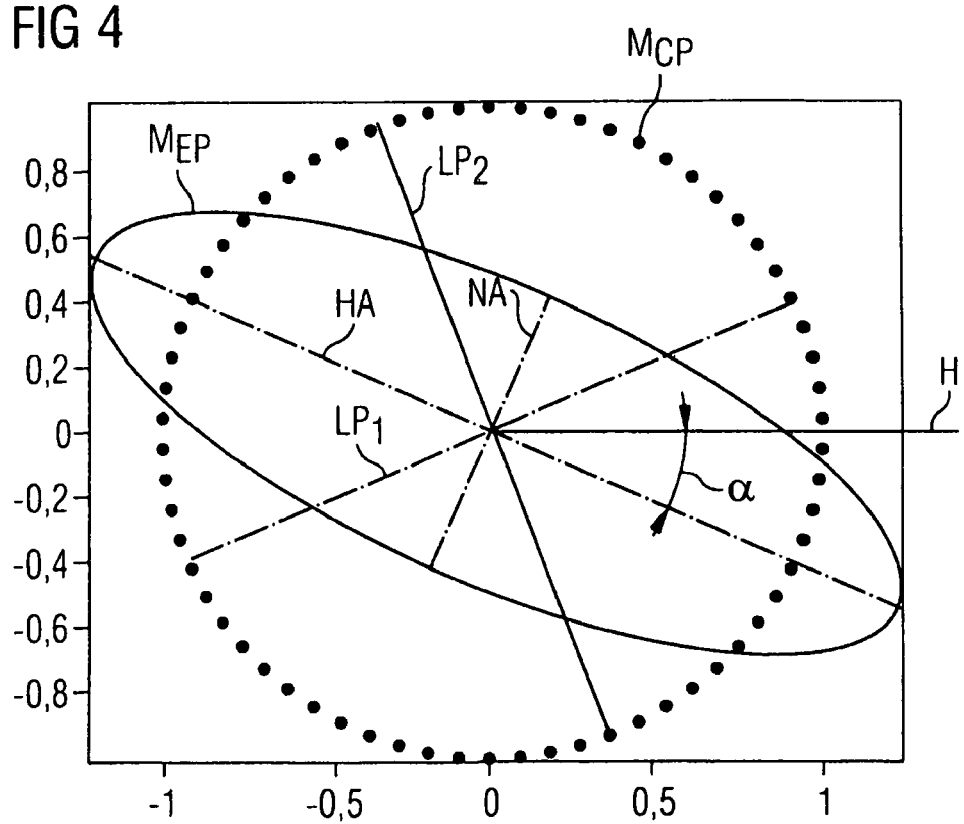
FIG. 4 is a diagram to explain the bearing of the ellipse of the elliptically polarized radio-frequency field.

FIG. 4 is referenced for definition of an optimal bearing of the major axis HA of the elliptical polarization. Respectively plotted here is the bearing of the tip of the radio-frequency field vector rotating around the origin in the Cartesian coordinate system (the units of the coordinate axes are thereby arbitrarily selected). For comparison, the circle here characterizes the circularly polarized mode $M_{CP}$ which would be achieved in a normal antenna according to the prior art via the two partial signals fed in at 90° with a phase shift of 90°. The amplitude of the radio-frequency field thereby does not change over a revolution. The line $LP_1$ represents the linearly polarized radio-frequency field which would be generated in the antenna by the partial RF signal fed in at the one connection point of the whole-body antenna, and the line $LP_2$ represents the linearly polarized radio-frequency field which would be generated in the antenna by the partial RF signal fed in at the other connection point of the whole-body antenna. The circularly polarized mode $M_{CP}$ arises via the superimposition of the two linearly polarized fields.

The antenna 2 is advantageously fashioned so that an elliptical transmission mode $M_{EP}$ is generated, meaning that the amplitude of the radio-frequency field changes over one revolution. The shape of the ellipse is determined by the ratio of the major axis HA and the minor axis NA. This ratio advantageously lies between 1.5 and 10, particularly preferably between 2 and 5.

The elliptical transmission mode $M_{EP}$ is thereby preferably fashioned so that the major axis HA of the elliptically polarized field is tilted in the clockwise direction of the indicated horizontal H by an angle α between at least 15° and 70°, particularly preferably between 22° and 50°. The bearing shown in FIG. 4 respectively applies from a consideration from the "service end" of the magnetic resonance scanner (i.e. from the head), which is opposite the end at which the examination table is driven into and out of the magnetic resonance scanner.

The shape and bearing of the polarization ellipse that is required for an optimal homogeneity in the abdominal region of the patient is presented in FIG. 4. Here the ratio of the major axis to minor axis is 3, and the tilt angle α is 22° relative to the horizontal.

Figure 5:
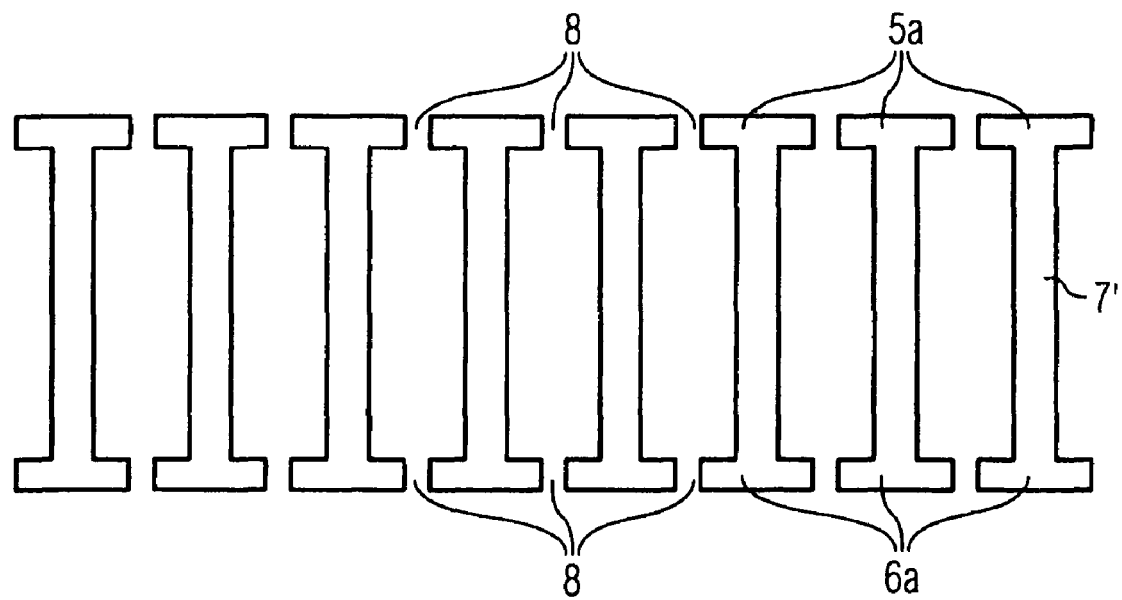
FIG. 5 is a schematic illustration of a winding of half of a 16-rod whole-body antenna according to the prior art.
Figure 6:
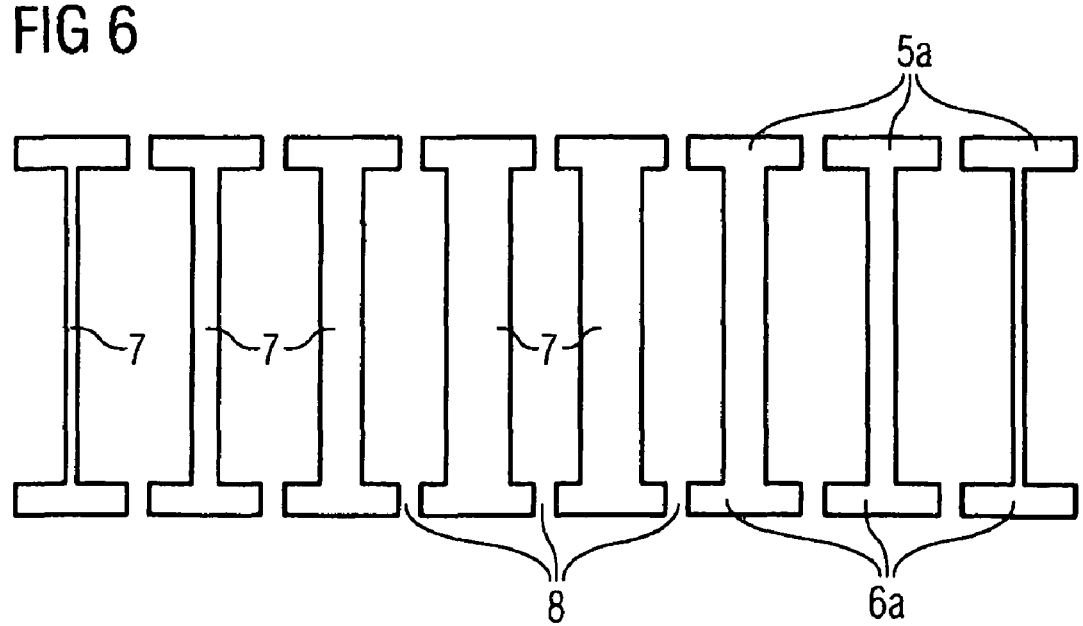
FIG. 6 is a schematic illustration of an exemplary embodiment of half of a 16-rod whole-body antenna according to the invention.

A very simple possibility to realize a whole-body antenna with an intrinsic transmission characteristic for emission of an elliptically polarized field is now explained using FIGS. 5 and 6.

FIG. 5 shows a winding of half of a 16-rod antenna according to the prior art. The individual conductor rods 7' (which are normally copper conductor traces applied on the outside of an examination tunnel tube) are all selected with the same width here. The individual conductor rods 7' are respectively connected at the ends with ring segments 5a, 6a running transversal to the conductor rods or, respectively, the conductor traces are fashioned so that these annular segments 5a, 6a respectively form T-shaped end pieces of the conductor rods 7. Respective free spaces 8 which are bridged by capacitor elements in order to capacitively couple the individual conductor rods 7' with one another are located between the individual ring segments 5a, 6a. In that all conductor rods 7' are fashioned identically and the same capacitors are respectively used to couple the individual ring segments 5a, 6a among one another, the antenna is completely symmetrical and emits a circularly polarized field given the design presented in FIG. 1.

FIG. 6 shows a simple variant to modify the transmission characteristic of the antenna 2 so that it emits an elliptically polarized field. It is hereby merely provided that the conductor rods 7 or copper conductor traces are fashioned with different widths. Due to the different conductor cross-sections, the individual conductor rods 7 have different inductances, which lead to a different current distribution to the individual antenna rods 7. Additionally, the ohmic resistance is also altered by the different conductor trace widths (which plays a smaller role given radio-frequency signals, however). Alternatively or additionally, it can also be provided that the capacitances of the antenna rods 7 are different. Different capacitances between the individual ring segments 5a, 6a can likewise be provided. Since FIG. 6 shows only eight of the sixteen antenna rods of the whole-body antenna, it is clear that in a complete whole-body antenna the respective opposite antenna rods 7 exhibit the same width, and thus the same impedance.

It is also apparent here that the separation of the impedances is greatest between the antenna rods situated perpendicular to one another, and that the impedance continuously increases in steps among the antenna rods from rods with the most impedance (the two outermost antenna rods in FIG. 6) to antenna rods with the smallest impedance (the middle antenna rods in FIG. 6) in order to achieve a particularly uniform elliptical shape.

Figure 7:
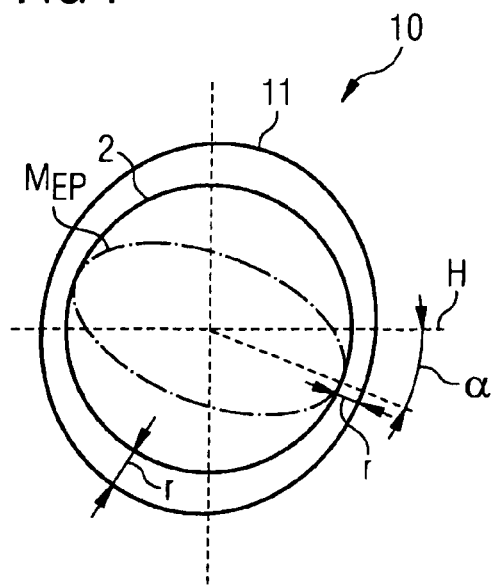
FIG. 7 is a schematic cross-section perpendicular to the longitudinal direction of the antenna through an exemplary embodiment of an antenna system according to the invention, with a circular antenna and an elliptical radio-frequency shielding.
Figure 8:
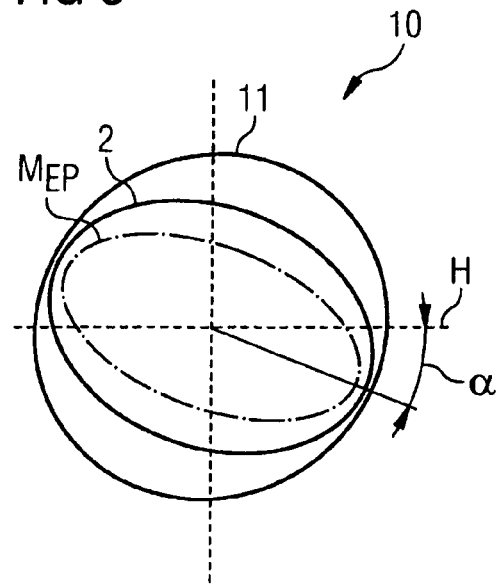
FIG. 8 is a schematic cross-section perpendicular to the longitudinal direction of the antenna through an exemplary embodiment of an antenna system according to the invention, with an elliptical antenna and a circular radio-frequency shielding.
Figure 9:
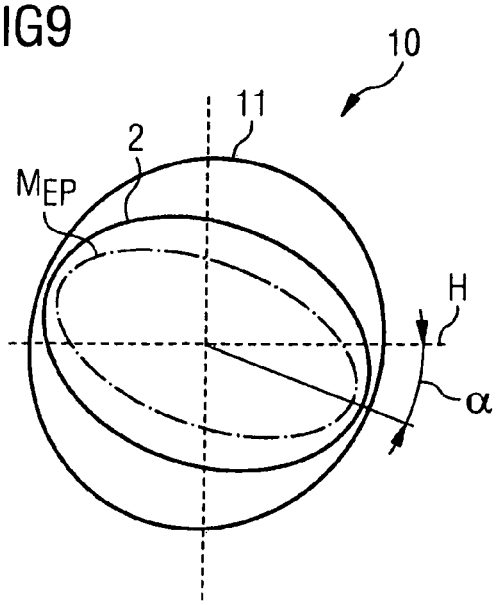
FIG. 9 is a schematic cross-section perpendicular to the longitudinal direction of the antenna through an exemplary embodiment of an antenna system according to the invention, with an elliptical antenna and an elliptical radio-frequency shielding.

FIGS. 7, 8 and 9 show three variants as to how an elliptically polarized field or a corresponding transmission characteristic of the whole-body antenna 2 of the antenna system can be achieved via suitable shape of the whole-body antenna 2 and a radio-frequency shielding surrounding the whole-body antenna 2. This radio-frequency shielding 11 is typically connected with a ground potential and provides for a shielding of the antenna 2 against the additional components situated outside of the antenna 2 in the magnetic resonance scanner. The inductance and stray capacitance of the whole-body antenna 2 or its individual antenna rods 7 relative to the radio-frequency shielding 11 are also determined by the distance of said whole-body antenna 2 or, respectively, its individual antenna rods 7 from said radio-frequency shielding 11. Therefore the radial distance r (i.e. the distance running in the radial direction between the antenna 2 and the radio-frequency shielding 11) also respectively influences the impedance in the appertaining part of the whole-body antenna 2. If the radial distance r is relatively small, a high capacitance and a small inductance (and thus also a high impedance) of the antenna 2 are provided in this region. In contrast to this, if the distance r is relatively large, the stray capacitance is also low and the inductance (and thus the impedance) at this point is higher. FIG. 7 thereby shows a first variant in which a typical whole-body antenna 2 with a circular cross-section is used and a slightly elliptical shape of the radio-frequency shielding 11 is selected. FIG. 8 shows a variant in which a radio-frequency shielding 11 with a circular cross-section is used, however the whole-body antenna 2 has an elliptical cross-section. FIG. 9 shows an exemplary embodiment in which both the whole-body antenna 2 and the radio-frequency shielding 11 possess an elliptical cross-section, wherein the major axes of the ellipses are tilted by 90° relative to one another. The bearing of the ellipses of the two components 2, 11 is shown in order to achieve a specific angle α between the major axis HA of the ellipse shape of the emitted, elliptically polarized radio-frequency field and the horizontal H, as this was explained using FIG. 4.

The preceding exemplary embodiments show how a whole-body antenna with an intrinsic transmission characteristic so that an elliptically polarized field is emitted can be realized with simple means. A field with improved $B_1$ homogeneity can thus be achieved in a simple manner, wherein no additional hardware expenditure is necessary apart from the slight measures described above. However, these measures are significantly more advantageous than the realization of two or more transmission channels, in particular of a corresponding number of transmission amplifiers. Retrofitting of existing systems can ensue via a simple exchange of the transmission antenna or the radio-frequency shielding.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance system configured for generating a magnetic resonance exposure of an examination subject, said system comprising:
a magnetic resonance scanner having an examination tunnel therein configured to receive an examination subject therein;
a whole-body antenna built into said scanner housing, said whole-body antenna comprising:
two connection terminals and
said whole-body antenna cylindrically extending around said tunnel along
a longitudinal axis of said tunnel and said whole-body antenna;
a radio-frequency supply device that supplies radio-frequency signals to said whole-body antenna that cause said whole-body antenna to emit a radio-frequency field in said tunnel, said radio-frequency supply device comprising:
a radio-frequency generator that generates said radio-frequency signal,
a signal splitter that divides said radio-frequency signal from said radio-frequency generator into two partial signals that are phase-shifted by 90° relative to each other, and
two radio-frequency feed lines respectively connected with said two connection terminals of said whole-body antenna in order to respectively feed said two partial signals to said whole-body antenna; and
said whole-body antenna having an intrinsic transmission characteristic that causes the radio-frequency field to be elliptically polarized in plane that is perpendicular to said longitudinal axis to and have a major ellipse axis that is tilted by a non-zero angle relative to the horizontal, at least in an unloaded state of said examination tunnel with no examination subject present therein.

2. A magnetic resonance system as claimed in claim 1 wherein said whole-body antenna has an intrinsic transmission characteristic that causes said elliptically polarized radio-frequency field to be formed with a ratio of the major ellipse axis thereof to the minor ellipse axis thereof in a range between 1.5 and 10.

3. A magnetic resonance system as claimed in claim 1 wherein said whole-body antenna has an intrinsic transmission characteristic that causes said elliptically polarized radio-frequency field to be formed with a ratio of the major ellipse axis thereof to the minor ellipse axis thereof in a range between 2 and 5.

4. A magnetic resonance system as claimed in claim 1 comprising
a movable patient table that is mounted for feeding into said examination tunnel from a feed end of said examination tunnel, and
wherein said non-zero angle, with respect to said feed end of said examination tunnel and an end of said examination tunnel opposite thereto, is between 15° and 70°.

5. A magnetic resonance system as claimed in claim 1 comprising
a movable patient table that is mounted for feeding into said examination tunnel from a feed end of said examination tunnel, and
wherein said non-zero angle, with respect to said feed end of said examination tunnel and an end of said examination tunnel opposite thereto, is between 22° and 50°.

6. A magnetic resonance system as claimed in claim 1 comprising:
radio-frequency shielding cylindrically surrounding the whole-body antenna, and
wherein said whole-body antenna is comprised of:
a plurality of antenna elements annularly distributed around said examination tunnel, and
wherein said whole-body antenna is disposed relative to said radio-frequency shielding in order to cause at least two of said antenna elements, located at different circumferential positions around the examination tunnel, to exhibit respectively different impedances.

7. A magnetic resonance system as claimed in claim 6 wherein said whole-body antenna is disposed relative to said radio-frequency shielding with non-uniform radial separation, around said circumference, between said whole-body antenna and said radio-frequency shielding.

8. A magnetic resonance system as claimed in claim 7 wherein said whole-body antenna has a circular cross-section and said radio-frequency shielding has an elliptical cross-section in plane perpendicular to said longitudinal axis.

9. A magnetic resonance system as claimed in claim 6 wherein said antenna elements are antenna rods proceeding parallel to said longitudinal axis.

10. A magnetic resonance system as claimed in claim 9 wherein said whole-body antenna has a cage structure comprising:
antenna ring elements respectively connecting said antenna rods,
with at least two ring segments of said antenna ring elements, respectively located at different circumferential positions around said examination tunnel, exhibiting respectively different impedances.

11. A magnetic resonance system as claimed in claim 9 wherein said at least two antenna rods at different circumferential positions exhibit different conductor cross-sections, respectively.

12. A magnetic resonance system as claimed in claim 9 wherein the at least two antenna rods, and/or the at least two ring segments, located at respectively different circumferential positions exhibit respectively different capacitances.

13. A magnetic resonance system as claimed in claim 6 wherein at least two of said antenna elements located at opposite circumferential positions exhibit equal respective impedances.

14. A magnetic resonance system as claimed in claim 13 wherein at least two first antenna elements located at opposite circumferential positions exhibit a maximum impedance, and at least two second antenna elements located at 90° relative to said first antenna elements exhibit a minimum impedance.

15. A magnetic resonance system as claimed in claim 14 wherein antenna elements respectively located between said first and second antenna elements have respective impedances that decrease from the first antenna elements to the second antenna elements in said circumferential direction.

16. An antenna system configured for a magnetic resonance system, said antenna system comprising:
a whole-body antenna having two connection terminals, said whole-body antenna being configured to extend cylindrically around an examination tunnel of a magnetic resonance scanner along a longitudinal axis; and
said whole-body antenna having an intrinsic transmission characteristic that causes said whole-body antenna, when two identical partial signals phase-shifted by 90° relative to each other are fed into said whole-body antenna at said two connection terminals, to emit a radio-frequency field in said examination tunnel that is elliptically polarized in a plane situated perpendicular to the longitudinal axis and that has a major ellipse axis that is tilted by a non-zero angle relative to the horizontal, at least when said examination tunnel is empty.

17. An antenna system as claimed in claim 16 wherein said whole-body antenna comprises:
   a plurality of antenna elements annularly distributed around said examination tunnel and
   is located relative to a radio-frequency shielding of the magnetic resonance system, that cylindrically surrounds the whole-body antenna, in order to cause at least two of said antenna elements, respectively located at different circumferential positions around the examination tunnel, to exhibit respectively different impedances.

18. A method for designing a whole-body antenna configured for a magnetic resonance system having a magnetic resonance scanner with an examination tunnel therein, said method comprising the steps of:
   providing a whole-body antenna with two connection terminals;
   configuring said whole-body antenna to cylindrically extend around said examination tunnel along a longitudinal axis; and
   further configuring said whole-body antenna to have an intrinsic transmission characteristic that causes said whole-body antenna, when said two terminals thereof are respectively fed with partial radio-frequency signals that are phase-shifted by 90° relative to each other, to emit a radio-frequency field in said examination tunnel that is elliptically polarized in a plane perpendicular to the longitudinal axis and that has a major ellipse axis that is tilted by a non-zero angle relative to the horizontal, at least when said examination tunnel is empty.

19. A method for generating a magnetic resonance exposure of an examination subject comprising:
   placing an examination subject in an examination tunnel of a magnetic resonance system;
   cylindrically surrounding the examination subject in the examination tunnel with a whole-body antenna, said whole-body antenna extending along a longitudinal axis of said examination tunnel;
   supplying said whole-body antenna, via two respective supply terminals, with two identical partial radio-frequency signals that are phase-shifted by 90° relative to each other;
   configuring said whole-body antenna to have an intrinsic transmission characteristic that causes said whole-body antenna to irradiate the examination subject in the examination tunnel with a radio-frequency field that is elliptically polarized in a plane perpendicular to the longitudinal axis and that has a major ellipse axis that is tilted by a non\-zero angle relative to the horizontal, at least when the examination subject is not present in the examination tunnel; and
   acquiring magnetic resonance signals from the examination subject after irradiating the examination subject with said radio-frequency field, in order to obtain magnetic resonance signals from the examination subject, and
   reconstructing an image of the examination subject from said magnetic resonance signals.

* * * * *